(12) United States Patent
Asada et al.

(10) Patent No.: US 10,171,060 B2
(45) Date of Patent: Jan. 1, 2019

(54) HIGH PASS FILTER

(71) Applicant: Murata Manufacturing Co., Ltd., Nagaokakyo-shi, Kyoto-fu (JP)

(72) Inventors: Satoshi Asada, Nagaokakyo (JP); Hiroshi Masuda, Nagaokakyo (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 1 day.

(21) Appl. No.: 15/470,946

(22) Filed: Mar. 28, 2017

(65) Prior Publication Data
US 2017/0288633 A1    Oct. 5, 2017

(30) Foreign Application Priority Data

Mar. 31, 2016 (JP) .................................. 2016-071079

(51) Int. Cl.
*H03H 7/01* (2006.01)
*H01P 1/203* (2006.01)
*H03H 1/00* (2006.01)

(52) U.S. Cl.
CPC ....... *H03H 7/0115* (2013.01); *H01P 1/20345* (2013.01); *H03H 7/175* (2013.01); *H03H 7/1758* (2013.01); *H03H 2001/0085* (2013.01)

(58) Field of Classification Search
CPC ......... H03H 2001/0085; H03H 7/0115; H03H 7/1758
USPC ................................................. 333/175, 185
See application file for complete search history.

(56) References Cited

U.S. PATENT DOCUMENTS

| 2003/0076199 | A1 | 4/2003 | Yamaguchi | |
|---|---|---|---|---|
| 2005/0110596 | A1 | 5/2005 | Yamakawa et al. | |
| 2009/0315643 | A1* | 12/2009 | Yamakawa | H03H 7/0115 333/174 |
| 2014/0191824 | A1* | 7/2014 | Yoshino | H03H 7/427 333/185 |

FOREIGN PATENT DOCUMENTS

| EP | 2 106 023 A1 | 9/2009 |
|---|---|---|
| JP | 2002-016467 A | 1/2002 |
| JP | 2008-167157 A | 7/2008 |
| WO | 2008/062753 A1 | 5/2008 |

OTHER PUBLICATIONS

Official Communication issued in Japanese Patent Application No. 2016-071079, dated Oct. 2, 2018.

* cited by examiner

*Primary Examiner* — Rakesh Patel
(74) *Attorney, Agent, or Firm* — Keating & Bennett, LLP

(57) ABSTRACT

A high pass filter includes a first LC series resonator including a first end connected to a signal path, and a second end connected to at least one ground terminal, a second LC series resonator including a third end electrically connected to the signal path, and a fourth end connected to the at least one ground terminal, and a third capacitor between a first portion extending from a first capacitor to a first inductor and a second portion extending from a second capacitor to a second inductor.

17 Claims, 10 Drawing Sheets

HIGH PASS FILTER

CROSS REFERENCE TO RELATED APPLICATIONS

This application claims the benefit of priority to Japanese Patent Application No. 2016-071079 filed on Mar. 31, 2016. The entire contents of this application are hereby incorporated herein by reference.

BACKGROUND OF THE INVENTION

1. Field of the Invention

The present invention relates to a high pass filter, and particularly relates to a high pass filter including an LC series resonator.

2. Description of the Related Art

A high pass filter is described in Japanese Unexamined Patent Application Publication No. 2008-167157. FIG. 8 is an equivalent circuit diagram of a high pass filter 500 described in Japanese Unexamined Patent Application Publication No. 2008-167157. FIG. 9 is an exploded perspective view of the high pass filter 500 shown in FIG. 8.

As shown in FIG. 8, the high pass filter 500 includes input and output terminals 504 and 506; capacitors C201, C202, and C203; and LC series resonators LC101 and LC102. The capacitors C201, C202, and C203 are connected in series in this order between the input and output terminal 504 and the input and output terminal 506. The LC series resonator LC101 includes an inductor L101 and a capacitor C101. One end of the LC series resonator LC101 is connected between the capacitor C201 and the capacitor C202, whereas the other end of the LC series resonator LC101 is connected to ground. The LC series resonator LC102 includes an inductor L102 and a capacitor C102. One end of the LC series resonator LC102 is connected between the capacitor C202 and the capacitor C203, whereas the other end of the LC series resonator LC102 is connected to ground.

As shown in FIG. 9, the high pass filter 500 includes a multilayer body 502. The multilayer body 502 has a structure formed by stacking a plurality of insulator layers. The inductor L101 is positioned in the multilayer body 502, and is substantially in the shape of a helix that extends downward while being wound in a counterclockwise direction when viewed from above. The inductor L102 is positioned in the multilayer body 502, and is substantially in the shape of a helix that extends downward while being wound in a clockwise direction when viewed from above. The capacitor C101 is positioned near a lower surface of the multilayer body 502 and connected to the inductor L101. The capacitor C102 is positioned near the lower surface of the multilayer body 502 and connected to the inductor L102.

The high pass filter 500 has approximately two attenuation poles in the bandpass characteristic, as shown in the graph of FIG. 5 in Japanese Unexamined Patent Application Publication No. 2008-167157.

The approximately two attenuation poles of the high pass filter 500 may need to be brought close to each other. In such a case, for example, the shape of one of the inductor L101 and the inductor L102 may be changed to adjust the inductance value.

However, changing the shape of one of the inductor L101 and the inductor L102 breaks the symmetric structure of the high pass filter 500. This causes a difference between the bandpass characteristic obtained when the input and output terminal 504 is used as an input terminal and the input and output terminal 506 is used as an output terminal, and the bandpass characteristic obtained when the input and output terminal 506 is used as an input terminal and the input and output terminal 504 is used as an output terminal. As a result, the symmetry of input and output is changed or destroyed. An inductor or capacitor for impedance matching may be added to the high pass filter 500. However, this leads to an increased device size.

SUMMARY OF THE INVENTION

Preferred embodiments of the present invention provide high pass filters in which approximately two attenuation poles that appear in the bandpass characteristic are able to be brought close to each other without changing the symmetry of inductor electrodes and without increasing the device size.

A high pass filter according to a preferred embodiments of the present invention includes a first input and output terminal; a second input and output terminal; at least one ground terminal; a signal path disposed between the first input and output terminal and the second input and output terminal; a first LC series resonator including a first end electrically connected to the signal path, a second end electrically connected to the at least one ground terminal, a first inductor, and a first capacitor; a second LC series resonator including a third end electrically connected to the signal path, a fourth end electrically connected to the at least one ground terminal, a second inductor, and a second capacitor; and a third capacitor provided between a first portion and a second portion, the first portion extending from a first electrode of the first capacitor connected to the first inductor to a portion of the first inductor closer to the first electrode than an end of the first inductor not connected to the first capacitor, the second portion extending from a second electrode of the second capacitor connected to the second inductor to a portion of the second inductor closer to the second electrode than an end of the second inductor not connected to the second capacitor.

According to preferred embodiments of the present invention, high pass filters are provided in which approximately two attenuation poles that appear in the bandpass characteristic are able to be brought close to each other without changing or destroying the symmetry of inductor electrodes and without increasing the device size.

The above and other elements, features, steps, characteristics and advantages of the present invention will become more apparent from the following detailed description of the preferred embodiments with reference to the attached drawings.

DETAILED DESCRIPTION OF THE PREFERRED EMBODIMENTS

Hereinafter, the present invention will be clarified through description of specific preferred embodiments of the present invention with reference to the drawings. It is to be noted that the preferred embodiments described in this specification are merely examples, and that the structure, elements and features of the preferred embodiments are able to be partly replaced or combined among different preferred embodiments of the present invention.

Figure 1:
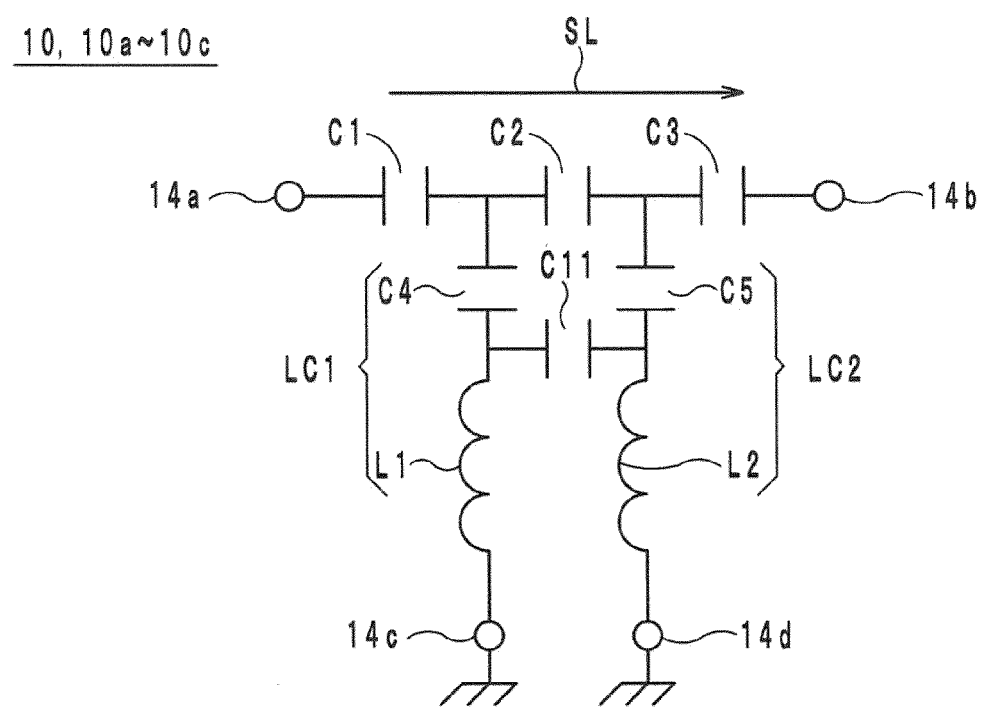
FIG. 1 is an equivalent circuit diagram of a high pass filter according to a preferred embodiment of the present invention.

A configuration of a high pass filter according to a preferred embodiment of the present invention is described below with reference to the drawings. FIG. 1 is an equivalent circuit diagram of any one of high pass filters 10, 10a, 10b, and 10c according to the present preferred embodiment.

As shown in FIG. 1, the high pass filter 10 includes a signal path SL; capacitors C1, C2, C3, and C11; LC series resonators LC1 and LC2; and outer electrodes 14a, 14b, 14c, and 14d. The outer electrodes 14a and 14b are input and output terminals. The outer electrodes 14c and 14d are ground terminals.

The signal path SL is a path that electrically connects the outer electrode 14a to the outer electrode 14b to provide a path that transmits high frequency signals. In the signal path SL, the capacitors C1, C2, and C3 are electrically connected in series in this order. High frequency signals transmitted through the signal path SL that are higher than a predetermined frequency are passed through the capacitors C1, C2, and C3.

The LC series resonator LC1 (an example of a "first LC series resonator") includes a capacitor C4 (an example of a "first capacitor") and an inductor L1 (an example of a "first inductor"). The capacitor C4 and the inductor L1 are electrically connected in series. Hereinafter, an end of the capacitor C4 that is not electrically connected to the inductor L1 is referred to as a first end of the LC series resonator LC1, and an end of the inductor L1 that is not electrically connected to the capacitor C4 is referred to as a second end of the LC series resonator LC1. The first end of the LC series resonator LC1 is electrically connected to the signal path SL. In the present preferred embodiment, the first end of the LC series resonator LC1 is electrically connected between the capacitor C1 and the capacitor C2. The second end of the LC series resonator LC1 is electrically connected to the outer electrode 14c.

The LC series resonator LC2 (an example of a "second LC series resonator") includes a capacitor C5 (an example of a "second capacitor") and an inductor L2 (an example of a "second inductor"). The capacitor C5 and the inductor L2 are electrically connected in series. Hereinafter, an end of the capacitor C5 not electrically connected to the inductor L2 is referred to as a third end of the LC series resonator LC2, and an end of the inductor L2 not electrically connected to the capacitor C5 is referred to as a fourth end of the LC series resonator LC2. The third end of the LC series resonator LC2 is electrically connected to the signal path SL. In the present preferred embodiment, the third end of the LC series resonator LC2 is electrically connected between the capacitor C2 and the capacitor C3. The fourth end of the LC series resonator LC2 is electrically connected to the outer electrode 14d. The LC series resonators LC1 and LC2 have a same or similar resonant frequency. The impedance of the LC series resonators LC1 and LC2 is significantly reduced or minimized at the resonant frequency. High frequency signals transmitted through the signal path SL that are at or near the resonant frequency are thus guided to ground.

The capacitor C11 (an example of a "third capacitor") is provided between a first portion and a second portion. The first portion of the capacitor C11 extends from a first electrode of the capacitor C4 that is electrically connected to the inductor L1 (i.e., a lower electrode of the capacitor C4 in FIG. 1) to a portion of the inductor L1 closer to the first electrode than an end of the inductor L1 that is not electrically connected to the capacitor C4 (i.e., a lower end of the inductor L1 in FIG. 1). The second portion of the capacitor C11 extends from a second electrode of the capacitor C5 that is electrically connected to the inductor L2 (i.e., a lower electrode of the capacitor C5 in FIG. 1) to a portion of the inductor L2 closer to the second electrode than an end of the inductor L2 that is not electrically connected to the capacitor C5 (i.e., a lower end of the inductor L2 in FIG. 1). More specifically, a first electrode of the capacitor C11 is electrically connected to the first portion extending from the first electrode of the capacitor C4 that is electrically connected to the inductor L1 to the portion of the inductor L1 closer to the first electrode than the end of the inductor L1 that is not electrically connected to the capacitor C4. A second electrode of the capacitor C11 is electrically connected to the second portion extending from the second electrode of the capacitor C5 that is electrically connected to the inductor L2 to the portion of the inductor L2 closer to the second electrode than the end of the inductor L2 that is not electrically connected to the capacitor C5. Therefore, the first electrode of the capacitor C11 is preferably not electrically connected to an electrode of the capacitor C4 that is not electrically connected to the inductor L1, for example. Similarly, the second electrode of the capacitor C11 is preferably not electrically connected to an electrode of the capacitor C5 that is not electrically connected to the inductor L2, for example. Likewise, for example, the first electrode of the capacitor C11 is preferably not electrically connected to the end of the inductor L1 that is not electrically connected to the capacitor C4, and the second electrode of the capacitor C11 is preferably not electrically connected to the end of the inductor L2 that is not electrically connected to the capacitor C5. In the present preferred embodiment, the first electrode of the capacitor C11 is electrically connected between the capacitor C4 and the inductor L1, and the second electrode of the capacitor C11 is electrically connected between the capacitor C5 and the inductor L2.

Figure 2:
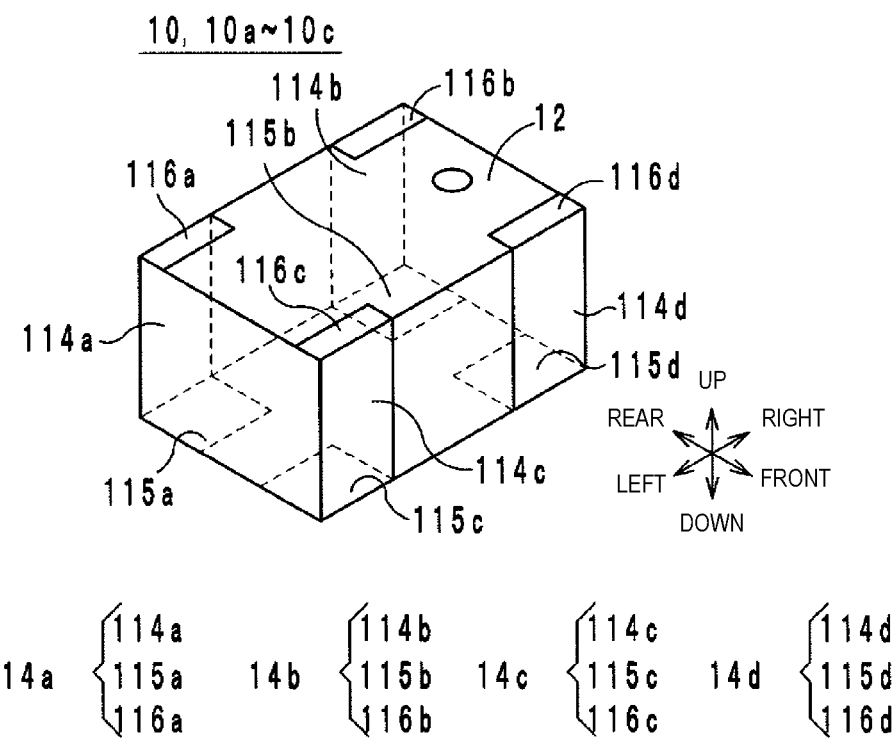
FIG. 2 is an external perspective view of the high pass filter shown in FIG. 1.
Figure 3:
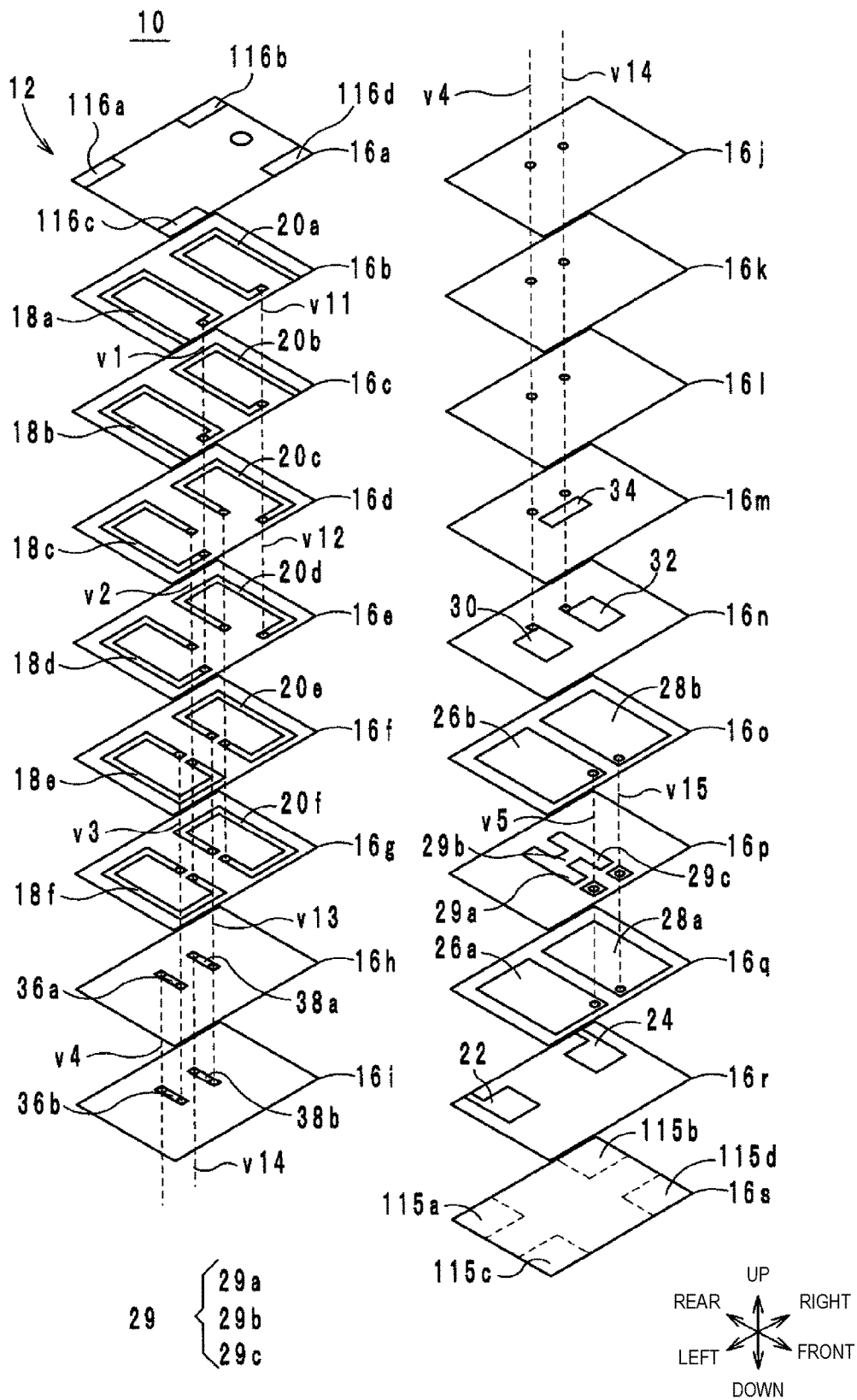
FIG. 3 is an exploded perspective view of a high pass filter.

Components and elements of the high pass filter 10 are described below with reference to the drawings. FIG. 2 is an external perspective view of any one of the high pass filters 10, 10a, 10b, and 10c. FIG. 3 is an exploded perspective view of the high pass filter 10. Hereinafter, a stacking direction of the high pass filter 10 is defined as an up-down direction, a direction along which the longer side of the high pass filter 10 extends when viewed in plan view from above is defined as a right-left direction, and a direction along which the shorter side of the high pass filter 10 extends when viewed in plan view from above is defined as a front-rear direction. The up-down direction, the right-left direction, and the front-rear direction are orthogonal or substantially orthogonal to each other. Note that the up-down direction, the right-left direction, and the front-rear direction in FIGS. 2 and 3 are shown as an example for the purpose of explanation, and do not necessarily need to correspond to the up-down direction, the right-left direction, and the front-rear direction during use or operation of the high pass filter 10.

As shown in FIGS. 2 and 3, the high pass filter 10 includes a multilayer body 12, the outer electrodes 14a, 14b, 14c, and 14d; inductor conductor layers 18a to 18f and 20a to 20f; capacitor conductor layers 22, 24, 26a, 26b, 28a, 28b, 29, 30, 32, and 34; connection conductor layers 36a, 36b, 38a, and 38b (the inductor conductor layers 18a to 18f, the capacitor conductor layers 26b and 30, and the connection conductor layers 36a and 36b are examples of "at least one first conductor layer" included in a first LC series resonator; and the inductor conductor layers 20a to 20f, the capacitor conductor layers 28b and 32, and the connection conductor layers 38a and 38b are examples of "at least one second conductor layer" included in a second LC series resonator), and via-hole conductors v1 to v5 and v11 to v15.

As shown in FIG. 3, the multilayer body 12 has a structure preferably formed by stacking insulator layers 16a to 16s (examples of "a plurality of insulator layers"), and preferably has a rectangular parallelepiped or substantially rectangular parallelepiped shape. The insulator layers 16a to 16s are preferably stacked in this order in the up-down direction, for example. The insulator layers 16a to 16s are dielectric layers which are preferably rectangular or substantially rectangular when viewed from above. Hereinafter, an upper principal surface of each of the insulator layers 16a to 16s is referred to as an upper surface.

The outer electrodes 14a, 14b, 14c, and 14d are disposed on an outer portion of the multilayer body 12. The outer electrode 14a (an example of a "first input and output terminal") includes a side portion 114a, a bottom portion 115a, and a top portion 116a. The top portion 116a is located at a left rear corner portion of the top surface of the multilayer body 12, and preferably is rectangular or substantially rectangular in shape. The bottom portion 115a is located at a left rear corner portion of a bottom surface of the multilayer body 12, and is rectangular or substantially rectangular in shape. The side portion 114a is located on a rear surface of the multilayer body 12, and extends along a short side on the left side of the rear surface of the multilayer body 12. The side portion 114a preferably is rectangular or substantially rectangular in shape, and electrically connects the bottom portion 115a to the top portion 116a.

The outer electrode 14b (an example of a "second input and output terminal") includes a side portion 114b, a bottom portion 115b, and a top portion 116b. The top portion 116b is located at a right rear corner portion of the top surface of the multilayer body 12, and preferably is rectangular or substantially rectangular in shape. The bottom portion 115b is located at a right rear corner portion of the bottom surface of the multilayer body 12, and preferably is rectangular or substantially rectangular in shape. The side portion 114b is located on the rear surface of the multilayer body 12, and extends along the short side on the right side of the rear surface of the multilayer body 12. The side portion 114b preferably is rectangular or substantially rectangular in shape, and electrically connects the bottom portion 115b to the top portion 116b.

The outer electrode 14c (an example of "at least one ground terminal") includes a side portion 114c, a bottom portion 115c (an example of a "bottom portion"), and a top portion 116c. The top portion 116c is located at a left front corner portion of the top surface of the multilayer body 12, and preferably is rectangular or substantially rectangular in shape. The bottom portion 115c is located at a left front corner portion of the bottom surface of the multilayer body 12 (an example of a "surface located on one side of the multilayer body in the stacking direction"), and preferably is rectangular or substantially rectangular in shape. The side portion 114c is located on the front surface of the multilayer body 12, and extends along the short side on the left side of the front surface. The side portion 114c preferably is rectangular or substantially rectangular in shape, and electrically connects the bottom portion 115c to the top portion 116c.

The outer electrode 14d (an example of "at least one ground terminal") includes a side portion 114d, a bottom portion 115d (an example of a "bottom portion"), and a top portion 116d. The top portion 116d is located at a right front corner portion of the top surface of the multilayer body 12, and preferably is rectangular or substantially rectangular in shape. The bottom portion 115d is located at a right front corner portion of the bottom surface of the multilayer body 12 (an example of a "surface located on one side of the multilayer body in the stacking direction"), and preferably is rectangular or substantially rectangular in shape. The side portion 114d is located on the front surface of the multilayer body 12, and extends along the short side on the right side of the front surface. The side portion 114d preferably is rectangular or substantially rectangular in shape, and electrically connects the bottom portion 115d to the top portion 116d. The outer electrodes 14a, 14b, 14c, and 14d are preferably formed by applying Ni plating, Sn plating, or Au plating onto a base electrode that includes Ag or Cu.

The capacitor C1 includes the capacitor conductor layers 22 and 26a. The capacitor conductor layer 22 is disposed on an upper surface of the insulator layer 16r, and preferably is rectangular or substantially rectangular in shape when viewed from above. When viewed from above, the capacitor conductor layer 22 is located adjacent to or in a vicinity of a left rear corner portion of the upper surface of the insulator layer 16r, and extends to a position adjacent to or in a vicinity of the left end of the long side on the rear side of the insulator layer 16r. The capacitor conductor layer 22 is thus electrically connected to the side portion 114a (i.e., outer electrode 14a).

The capacitor conductor layer 26a is disposed on an upper surface of the insulator layer 16q, and preferably is rectangular or substantially rectangular in shape when viewed from above. The capacitor conductor layer 26a covers substantially the entire left half of the insulator layer 16q, but does not extend to the outer edge of the insulator layer 16q. The capacitor conductor layer 22 and the capacitor conductor layer 26a face each other, with the insulator layer 16r interposed therebetween. That is, the capacitor C1 is located between the capacitor conductor layer 22 and the capacitor conductor layer 26a.

The capacitor C4 includes the capacitor conductor layers 26b and 30. The capacitor conductor layer 26b is disposed on an upper surface of the insulator layer 16o, and preferably is rectangular or substantially rectangular in shape when viewed from above. The capacitor conductor layer 26b includes a same or similar shape as the capacitor conductor layer 26a, and at least partially overlaps with the capacitor conductor layer 26a when viewed from above.

The capacitor conductor layer 30 (an example of "second capacitor conductor layer" included in at least one first conductor layer) is disposed on an upper surface of the insulator layer 16n, and preferably is rectangular or substantially rectangular in shape when viewed from above. The capacitor conductor layer 30 is located to the left of the center, according to an intersection of diagonal lines, of the upper surface of the insulator layer 16n when viewed from above. The capacitor conductor layer 26b and the capacitor conductor layer 30 face each other, with the insulator layer 16n interposed therebetween. That is, the capacitor C4 is located between the capacitor conductor layer 26b and the capacitor conductor layer 30.

The via-hole conductor v5 passes through the insulator layers 16o and 16p in the up-down direction, and electrically connects the capacitor conductor layer 26a to the capacitor conductor layer 26b. Accordingly, the capacitor C1 is electrically connected to the capacitor C4.

The inductor L1 (an example of a "first inductor") includes the inductor conductor layers 18a to 18f (examples of "at least one first inductor conductor layer" included in at least one first conductor layer), the connection conductor layers 36a and 36b, the via-hole conductors v1, v2, and v3 (examples of "at least one via-hole conductor"), and the via-hole conductor v4 (an example of a "first via-hole conductor"). By electrically connecting the inductor conductor layers 18a to 18f with the via-hole conductors v1, v2, and v3, the inductor L1 is able to be provided with a helical or substantially helical shape extending downward while being wound in a clockwise direction (an example of a "predetermined direction") when viewed from above. Although the inductor L1 is three-dimensionally (or helically) wound in the present preferred embodiment, the inductor L1 may be two-dimensionally (or spirally) wound.

The inductor conductor layers 18a and 18b are disposed on respective upper surfaces of the insulator layers 16b and 16c, and are linear conductor layers have include the same or similar shape. The inductor conductor layers 18c and 18d are disposed on respective upper surfaces of the insulator layers 16d and 16e, and are linear conductor layers that have the same or similar shape. The inductor conductor layers 18e and 18f are disposed on respective upper surfaces of the insulator layers 16f and 16g, and are linear conductor layers that have the same or similar shape.

In the left half of the insulator layers 16b to 16g, the inductor conductor layers 18a to 18f are each wound in a clockwise direction when viewed from above. The inductor conductor layers 18a to 18f overlap each other to define the outline of preferably a rectangular or substantially rectangular shape including a long side extending in the front-rear direction when viewed from above. Hereinafter, one end of each of the inductor conductor layers 18a to 18f on the upstream side in the clockwise direction is referred to as an upstream end, and another end of each of the inductor conductor layers 18a to 18f on the downstream side in the clockwise direction is referred to as a downstream end. The upstream end of each of the inductor conductor layers 18a and 18b extends beyond the outline of the rectangular or substantially rectangular shape to a location adjacent to or in a vicinity of the left end of the long side on the front side of the corresponding one of the insulator layers 16b and 16c. The inductor conductor layers 18a and 18b are thus electrically connected to the side portion 114c (outer electrode 14c). That is, the upper end of the inductor L1 (an example of an "end of the first inductor on the other side of the multilayer body in the stacking direction") is electrically connected through the side portion 114c to the bottom portion 115c.

The connection conductor layers 36a and 36b are disposed on respective upper surfaces of the insulator layers 16h and 16i, and linearly or substantially linearly extend in the front-rear direction when viewed from above. The connection conductor layers 36a and 36b are each located to the left of the center (i.e., an intersection of diagonal lines) of the surface of the corresponding one of the insulator layers 16h and 16i when viewed from above.

The via-hole conductor v1 passes through the insulator layers 16b to 16d in the up-down direction, and electrically connects the downstream ends of the inductor conductor layers 18a and 18b to the upstream ends of the inductor conductor layers 18c and 18d. The via-hole conductor v2 passes through the insulator layers 16d to 16f in the up-down direction, and electrically connects the downstream ends of the inductor conductor layers 18c and 18d to the upstream ends of the inductor conductor layers 18e and 18f. The via-hole conductor v3 passes through the insulator layers 16f to 16h in the up-down direction, and electrically connects the downstream ends of the inductor conductor layers 18e and 18f to the front ends of the connection conductor layers 36a and 36b. The inductor L1 is thus provided with a helical or substantially helical shape.

The via-hole conductor v4 passes through the insulator layers 16h to 16m in the up-down direction, and electrically connects the rear ends of the connection conductor layers 36a and 36b to the capacitor conductor layer 30. The inductor L1 and the capacitor C4 are thus electrically connected in series to define the LC series resonator LC1. The capacitor C4 is located below the inductor L1.

The capacitor C3 includes the capacitor conductor layers 24 and 28a. When viewed from above, the capacitor conductor layers 24 and 28a and the capacitor conductor layers 22 and 26a are symmetric or substantially symmetric with respect to a plane passing through the center of the multilayer body 12 and parallel or substantially parallel to the front-rear and up-down directions. Therefore, the structure of the capacitor conductor layers 24 and 28a will not be described in detail here.

The capacitor C5 includes the capacitor conductor layer 28b and the capacitor conductor layer 32 (an example of a "third capacitor conductor layer"). When viewed from above, the capacitor conductor layers 28b and 32 and the capacitor conductor layers 26b and 30 are symmetric or substantially symmetric with respect to a plane passing through the center of the multilayer body 12 and parallel or substantially parallel to the front-rear and up-down directions. Therefore, the structure of the capacitor conductor layers 28b and 32 will not be described in detail here.

The via-hole conductor v15 passes through the insulator layers 16o and 16p in the up-down direction, and electrically connects the capacitor conductor layer 28a to the capacitor conductor layer 28b. Accordingly, the capacitor C3 is electrically connected to the capacitor C5.

The inductor L2 (an example of a "second inductor") includes the inductor conductor layers 20a to 20f (examples of "at least one second inductor conductor layer" included in at least one second conductor layer), the connection conductor layers 38a and 38b, the via-hole conductors v11 to v13 (examples of "at least one via-hole conductor"), and the via-hole conductor v14 (an example of a "second via-hole conductor"). When viewed from above, the inductor conductor layers 20a to 20f, the connection conductor layers 38a and 38b, and the via-hole conductors v11 to v14 are symmetrical or substantially symmetrical to the inductor conductor layers 18a to 18f, the connection conductor layers 36a and 36b, and the via-hole conductors v1 to v4 with respect to a virtual plane passing through the center of the multilayer body 12 and parallel to the front-rear and up-down directions. Therefore, the structure of the inductor conductor layers 20a to 20f, the connection conductor layers 38a and 38b, and the via-hole conductors v11 to v14 will not be described in detail here.

The capacitor C2 includes the capacitor conductor layers 26a, 26b, 28a, 28b, and 29. The capacitor conductor layer 29 is disposed on an upper surface of the insulator layer 16p, and preferably is H-shaped or substantially H-shaped. The capacitor conductor layer 29 includes capacitance portions 29a and 29c and a connecting portion 29b. When viewed from above, the capacitance portion 29a is located to the left of a center of the upper surface of the insulator layer 16p, and preferably has a shape of a belt or substantially of a belt extending in the front-rear direction. The capacitor conductor layer 26a and the capacitance portion 29a face each other, with the insulator layer 16p interposed therebetween, and the capacitor conductor layer 26b and the capacitance portion 29a face each other, with the insulator layer 16o interposed therebetween. When viewed from above, the capacitance portion 29c is located to the right of the center of the upper surface of the insulator layer 16p, and preferably has a shape of a belt or substantially of a belt extending in the front-rear direction. The capacitor conductor layer 28a and the capacitance portion 29c face each other, with the insulator layer 16p interposed therebetween, and the capacitor conductor layer 28b and the capacitance portion 29c face each other, with the insulator layer 16o interposed therebetween. The connecting portion 29b electrically connects a center portion of the capacitance portion 29a in the front-rear direction to a center portion of the capacitance portion 29c in the front-rear direction. The capacitor C2 is thus located between the capacitor conductor layers 26a and 26b and the capacitor conductor layers 28a and 28b, with the capacitor conductor layer 29 interposed between the capacitor conductor layers 26a and 26b and the capacitor conductor layers 28a and 28b. The capacitor conductor layer 26a is included in the capacitor C1, and the capacitor conductor layer 28a is included in the capacitor C3. Accordingly, the capacitors C1, C2, and C3 are able to be electrically connected in series.

The capacitor C11 includes the capacitor conductor layers 30, 32, and 34. The capacitor conductor layer 34 (an example of a "first capacitor conductor layer") is disposed on an upper surface of the insulator layer 16m, and includes a rectangular or substantially rectangular shape with a long side extending in the right-left direction. The capacitor conductor layer 34 is thus located closer to the capacitor conductor layers 30 and 32 than to the inductor conductor layers 18f and 20f. The inductor conductor layers 18f and 20f are the lowest layers of the inductor conductor layers 18a to 18f and 20a to 20f. The capacitor conductor layer 34 is located in a center portion of the upper surface of the insulator layer 16m, and faces the capacitor conductor layers 30 and 32, with the insulator layer 16m interposed therebetween. The capacitor C11 is thus located between the capacitor conductor layers 30 and 32, with the capacitor conductor layer 34 interposed between the capacitor conductor layers 30 and 32. The capacitor conductor layer 30 is included in the capacitor C4, and the capacitor conductor layer 32 is included in the capacitor C5. The capacitor C11 is thus located between the capacitor C4 (i.e., LC series resonator LC1) and the capacitor C5 (i.e., LC series resonator LC2).

The inductor conductor layers 18a to 18f and 20a to 20f; the capacitor conductor layers 22, 24, 26a, 26b, 28a, 28b, 29, 30, 32, and 34; the connection conductor layers 36a, 36b, 38a, and 38b; and the via-hole conductors v1 to v5 and v11 to v15 include a conductive material, for example, Cu.

Figure 4A:
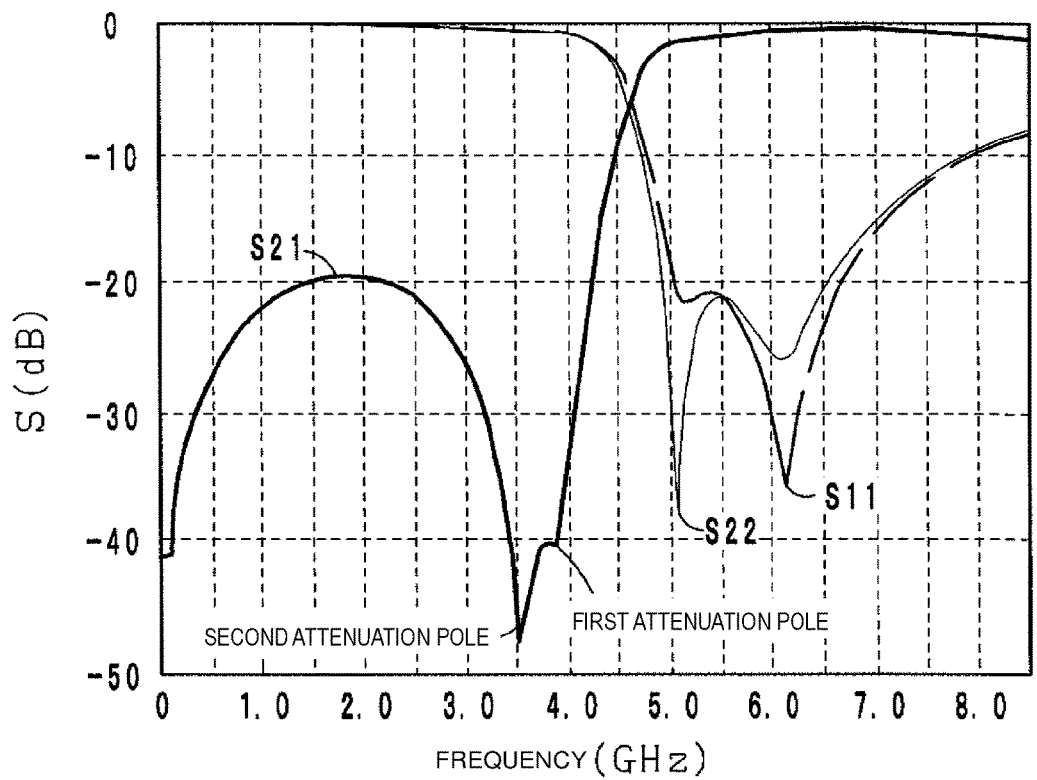
FIG. 4A is a graph showing a result of simulation of a bandpass characteristic and reflection characteristics of the high pass filter shown in FIG. 3.
Figure 4B:
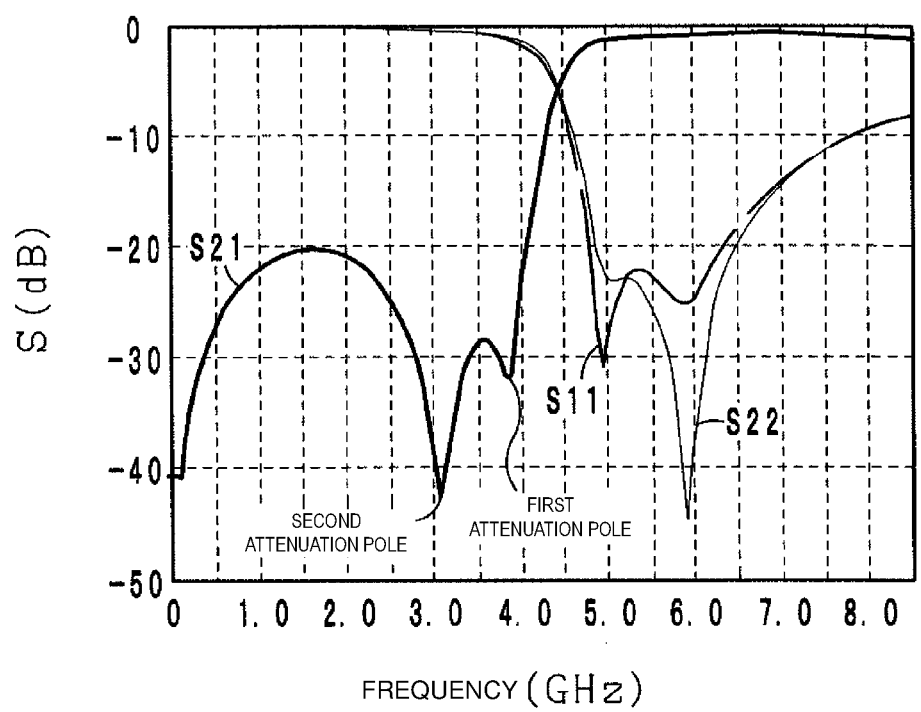
FIG. 4B is a graph showing a result of simulation of the bandpass characteristic and the reflection characteristics of a high pass filter according to a comparative example.

With the high pass filter 10 according to the present preferred embodiment, approximately two attenuation poles that appear in the bandpass characteristic are able to be brought close to each other. FIG. 4A is a graph showing a result of simulation of a bandpass characteristic S21 and reflection characteristics S11 and S22 of the high pass filter 10. FIG. 4B is a graph showing a result of simulation of the bandpass characteristic S21 and the reflection characteristics S11 and S22 of a high pass filter according to a comparative example. In FIGS. 4A and 4B, the vertical axis represents bandpass characteristic and reflection characteristic, and the horizontal axis represents frequency.

The high pass filter according to the comparative example differs from the high pass filter 10 in that it does not include the capacitor conductor layer 34. Components and elements of the high pass filter according to the comparative example are described below using the same reference numerals as those of the components and elements of the high pass filter 10. The bandpass characteristic S21 is a ratio of a strength of a signal output from the outer electrode 14b to a strength of a signal input from the outer electrode 14a. The reflection characteristic S11 is a ratio of a strength of a signal output from the outer electrode 14a to a strength of a signal input from the outer electrode 14a. The reflection characteristic S22 is a ratio of a strength of a signal output from the outer electrode 14b to a strength of a signal input from the outer electrode 14b.

In the high pass filter according to the comparative example, as shown in the graph of FIG. 4B, a first attenuation pole and a second attenuation pole are formed in the bandpass characteristic. The first attenuation pole is formed by the LC series resonators LC1 and LC2. The second attenuation pole is formed by the self-resonance of inductor components formed between the inductors L1 and L2 and ground. More specifically, in the high pass filter according to the comparative example, the upper ends of the inductors L1 and L2 are electrically connected to the bottom portions 115c and 115d, with the corresponding side portions 114c and 114d interposed therebetween. The side portions 114c and 114d each extend from the top surface to the bottom surface of the multilayer body 12 and are relatively long. The side portions 114c and 114d thus have a large inductance value. In the high pass filter according to the comparative example, the capacitors C4 and C5 are located below the inductors L1 and L2. The upper ends of the inductors L1 and L2 are thus significantly distant from the bottom surface of the multilayer body 12. Therefore, larger inductor components are formed between the inductor L1 and the bottom portion 115c and between the inductor L2 and the bottom portion 115d. The second attenuation pole is formed by the self-resonance of the inductor components in the comparative example. The inductor components in the comparative example cause the inductor L1 and the inductor L2 to be strongly magnetically coupled, and thus cause the first attenuation pole and the second attenuation pole to be spaced apart. The frequency of the second attenuation pole is lower than the frequency of the first attenuation pole. Therefore, when large inductor components are formed as in the high pass filter according to the comparative example, the frequency of the second attenuation pole is lowered and the first attenuation pole and the second attenuation pole are spaced apart.

In the high pass filter 10 of the present preferred embodiment, which includes the capacitor conductor layer 34, the capacitor C11 is located between the LC series resonator LC1 and the LC series resonator LC2. The results in the capacitor C11 providing a greater degree of capacitive coupling between the inductor L1 and the inductor L2 in the high pass filter 10 greater than a degree of coupling in the high pass filter according to the comparative example, and thus significantly reduces or prevents magnetic coupling between the inductor L1 and the inductor L2. Therefore, in the high pass filter 10, the degree of magnetic coupling between the inductor L1 and the inductor L2 is smaller than that in the high pass filter according to the comparative example. Thus, as shown in FIG. 4A, in the high pass filter 10, the first attenuation pole and the second attenuation pole are closer to each other than in the high pass filter according to the comparative example. The frequency of the second attenuation pole is lower than the frequency of the first attenuation pole. Therefore, when the degree of magnetic coupling is significantly reduced or prevented by an increase in the degree of capacitive coupling as in the high pass filter 10, the frequency of the second attenuation pole increases and brings the first attenuation pole and the second attenuation pole closer to each other.

The high pass filter 10 according to the present preferred embodiment is able to achieve a smaller size than the comparative example, as described below. Specifically, by adding about two or more capacitor conductor layers facing each other, with at least one insulator layer therebetween, to the high pass filter according to the comparative example, a capacitor equivalent to the capacitor C11 may be formed. Accordingly, in the comparative example, about two or more capacitor conductor layers are formed on about two or more respective different insulator layers, which increases the size of the multilayer body of the high pass filter. However, in the high pass filter 10 according to the present preferred embodiment, the capacitor conductor layer 34 is disposed to face the capacitor conductor layers 30 and 32. Preferably, for example, only one insulator layer 16m provides the capacitor conductor layer 34. The high pass filter 10 is thus able to provide a lower profile.

In the high pass filter 10 according to the present preferred embodiment, which includes the capacitor conductor layer 34, a decrease in a quality factor of the inductors L1 and L2 is able to be significantly reduced or prevented. More specifically, the capacitor C11 is located between the capacitor conductor layers 26a and 26b and the capacitor conductor layers 28a and 28b, with the capacitor conductor layer 34 interposed between the capacitor conductor layers 26a and 26b and the capacitor conductor layers 28a and 28b. In other words, the capacitor conductor layer 34 is disposed closer to the capacitor conductor layers 30 and 32 than to the inductor conductor layers 18f and 20f. Thus, since the capacitor conductor layer 34 is less likely to block a magnetic flux generated by the inductors L1 and L2, a decrease in the quality factor of the inductors L1 and L2 is able to be significantly reduced or prevented.

The high pass filter 10 according to the present preferred embodiment provides a high level of input and output symmetry. More specifically, in the high pass filter 10, when viewed from above, the capacitor conductor layer 34 is symmetric or substantially symmetric with respect to a plane passing through the center of the multilayer body 12 and parallel or substantially parallel to the front-rear and up-down directions. The capacitor C11 thus includes a symmetric or substantially symmetric structure. Therefore, the attenuation poles in the bandpass characteristic provided when the outer electrode 14a is implemented as an input terminal and the outer electrode 14b is implemented as an output terminal are brought close to each other, and the attenuation poles in the bandpass characteristic provided when the outer electrode 14b is implemented as an input terminal and the outer electrode 14a is implemented as an output terminal are brought close to each other.

Also in the high pass filter 10 according to the present preferred embodiment, the inductors L1 and L2 each have a large inductance value, because they are in the shape of or substantially in the shape of a three-dimensional helix.

First Modification

Figure 5:
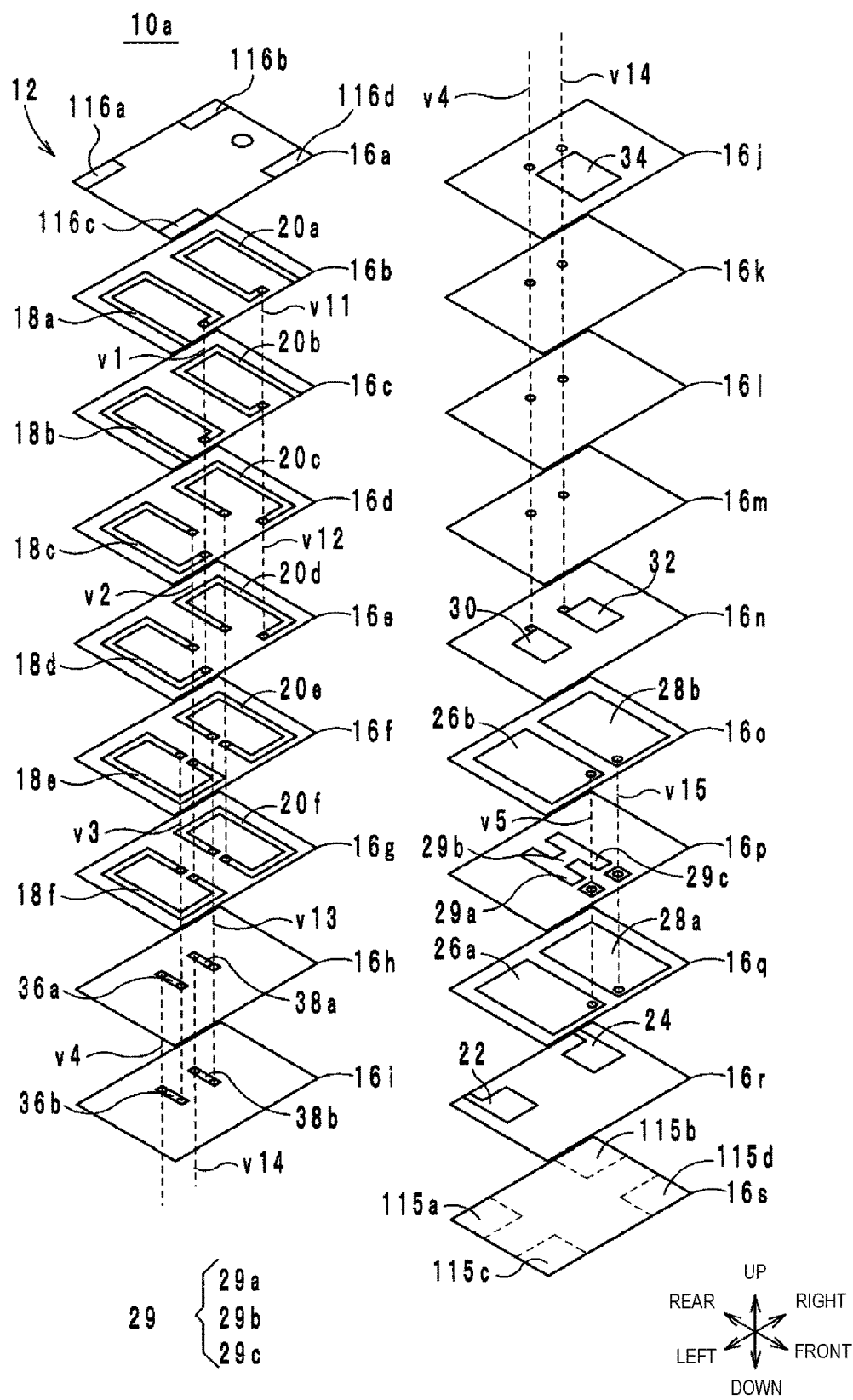
FIG. 5 is an exploded perspective view of a high pass filter according to a first modification of a preferred embodiment of the present invention.

A configuration of the high pass filter 10a according to a first modification of a preferred embodiment of the present invention is described below with reference to the drawings. FIG. 5 is an exploded perspective view of the high pass filter 10a according to the first modification. The equivalent circuit diagram and the external perspective view of the high pass filter 10a are the same as or similar to those of the high pass filter 10 shown in FIGS. 1 and 2, descriptions of which are referred to where appropriate.

The high pass filter 10a of the first modification differs from the high pass filter 10 described above in the location of the capacitor conductor layer 34. The structure of the high pass filter 10a is described below, with an emphasis on this difference.

The capacitor conductor layer 34 is disposed on an upper surface of the insulator layer 16j, and preferably is rectangular or substantially rectangular in shape. The capacitor conductor layer 34 is thus closer to the inductor conductor layers 18f and 20f than to the capacitor conductor layers 30 and 32. Specifically, the capacitor conductor layer 34 is located in a center portion of the upper surface of the insulator layer 16j, and faces the inductor conductor layers 18f and 20f, with the insulator layers 16g to 16i interposed therebetween. The capacitor C11 is thus located between the inductor conductor layer 18f and the inductor conductor layer 20f, with the capacitor conductor layer 34 interposed between the inductor conductor layers 18f and 20f. The inductor conductor layer 18f is included in the inductor L1, and the inductor conductor layer 20f is included in the inductor L2. The capacitor C11 is thus located between the inductor L1 (i.e., LC series resonator LC1) and the inductor L2 (i.e., LC series resonator LC2). Except the capacitor conductor layer 34, the configuration of the high pass filter 10a is similar to that of the high pass filter 10 and thus will not be described here.

With the high pass filter 10a of the first modification, as with the high pass filter 10 described above, approximately two attenuation poles that appear in the bandpass characteristic are able to be brought close to each other. Also similar to the high pass filter 10, the high pass filter 10a is able to provide a smaller size. Also similar to the high pass filter 10, the high pass filter 10a provides a high level of input and output symmetry. Also as in the high pass filter 10, the inductors L1 and L2 of the high pass filter 10a have a large inductance value, because they are in the shape of or substantially in the shape of a three-dimensional helix.

Second Modification

Figure 6:
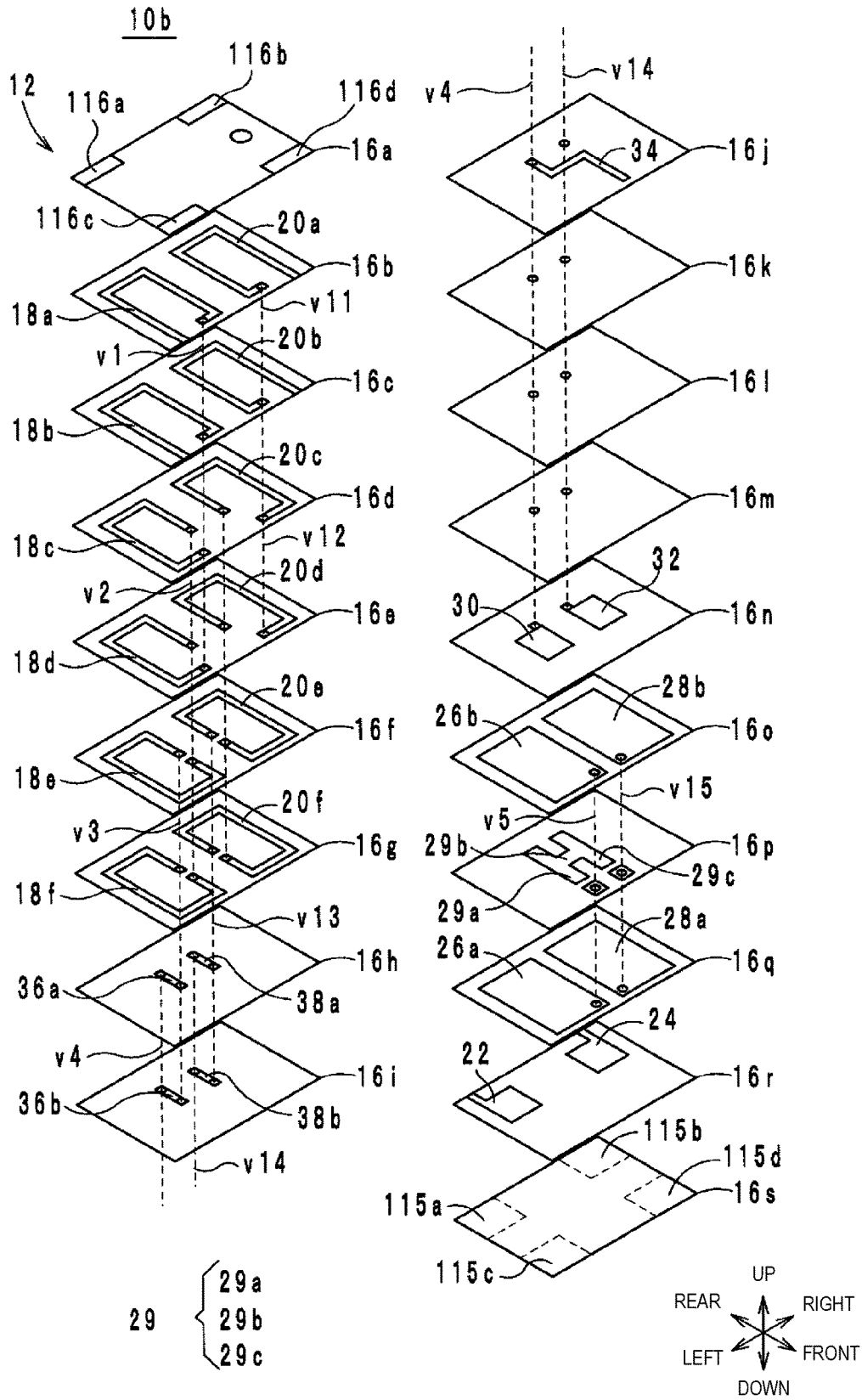
FIG. 6 is an exploded perspective view of a high pass filter according to a second modification of a preferred embodiment of the present invention.

A configuration of the high pass filter 10b according to a second modification of a preferred embodiment of the present invention is described below with reference to the drawings. FIG. 6 is an exploded perspective view of the high pass filter 10b according to the second modification. The equivalent circuit diagram and the external perspective view of the high pass filter 10b are the same as or similar to those of the high pass filter 10 shown in FIGS. 1 and 2, descriptions of which are referred to where appropriate.

The high pass filter 10b of the second modification differs from the high pass filter 10a described above in the shape of the capacitor conductor layer 34. The structure of the high pass filter 10b is described below, with an emphasis on this difference.

The capacitor conductor layer 34 is linearly or substantially linearly disposed on the upper surface of the insulator layer 16j. The capacitor conductor layer 34 is thus closer to the inductor conductor layers 18f and 20f than to the capacitor conductor layers 30 and 32. Specifically, the capacitor conductor layer 34 has a linear or substantially linear shape that extends toward the front, turns to extend toward the right, and then turns to further extend toward the front. The rear end of the capacitor conductor layer 34 is electrically connected to the via-hole conductor v4. The capacitor conductor layer 34 faces the inductor conductor layer 20f, with the insulator layers 16g to 16i interposed therebetween. The capacitor C11 is thus located between the capacitor conductor layer 34 and the inductor conductor layer 20f. The via-hole conductor v4 is included in the inductor L1, and the inductor conductor layer 20f is included in the inductor L2. The capacitor C11 is thus located between the inductor L1 (i.e., LC series resonator LC1) and the inductor L2 (i.e., LC series resonator LC2). Except the capacitor conductor layer 34, the configuration of the high pass filter 10b is similar to that of the high pass filter 10a and thus will not be described here.

With the high pass filter 10b of the second modification, as with the high pass filter 10a described above, approximately two attenuation poles that appear in the bandpass characteristic are able to be brought close to each other. Also similar to the high pass filter 10a, the high pass filter 10b is able to achieve a smaller size. Also as in the high pass filter 10a, the inductors L1 and L2 of the high pass filter 10b have a large inductance value, because they are in the shape of or substantially in the shape of a three-dimensional helix.

Third Modification

Figure 7:
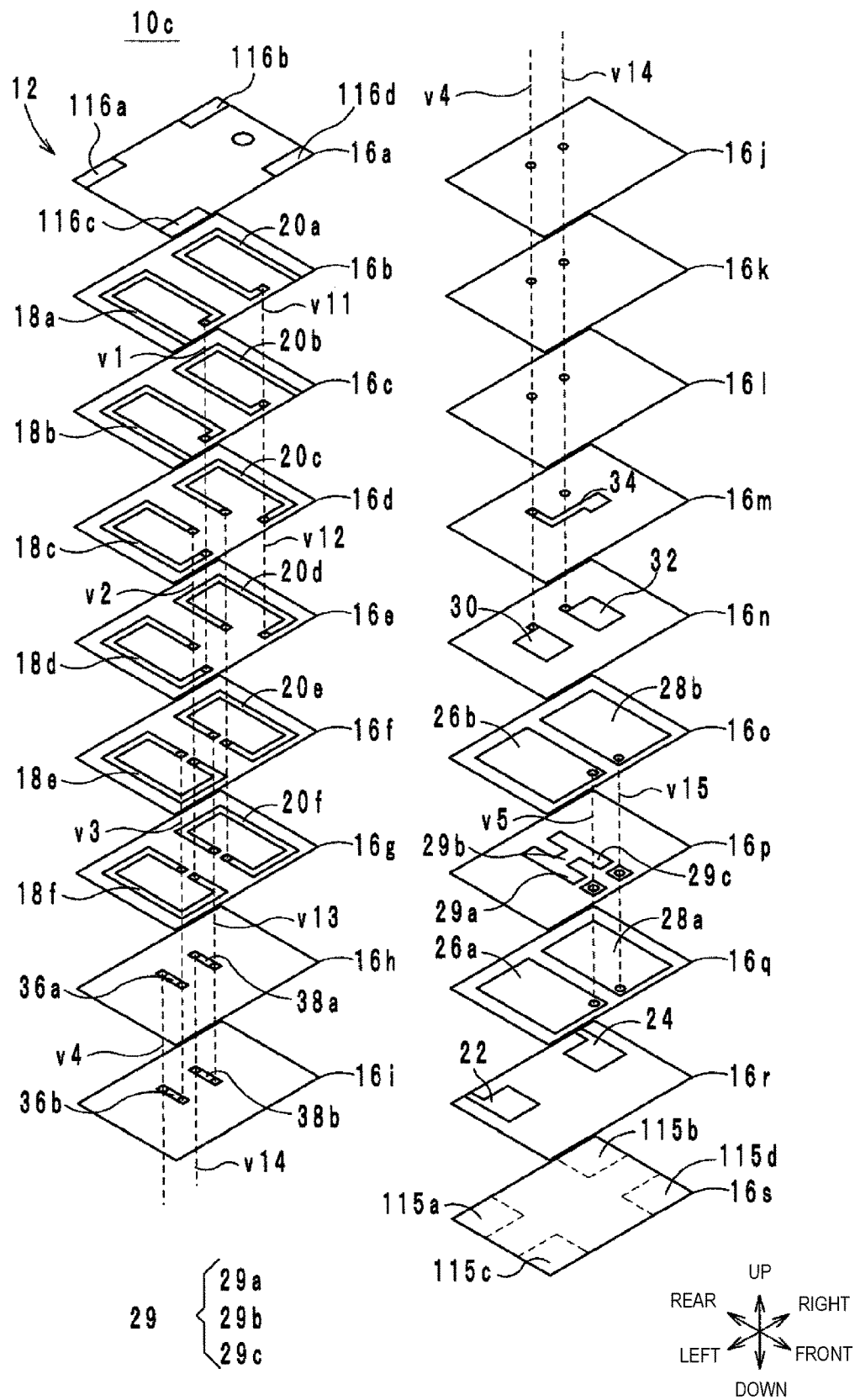
FIG. 7 is an exploded perspective view of a high pass filter according to a third modification of a preferred embodiment of the present invention.
Figure 8:
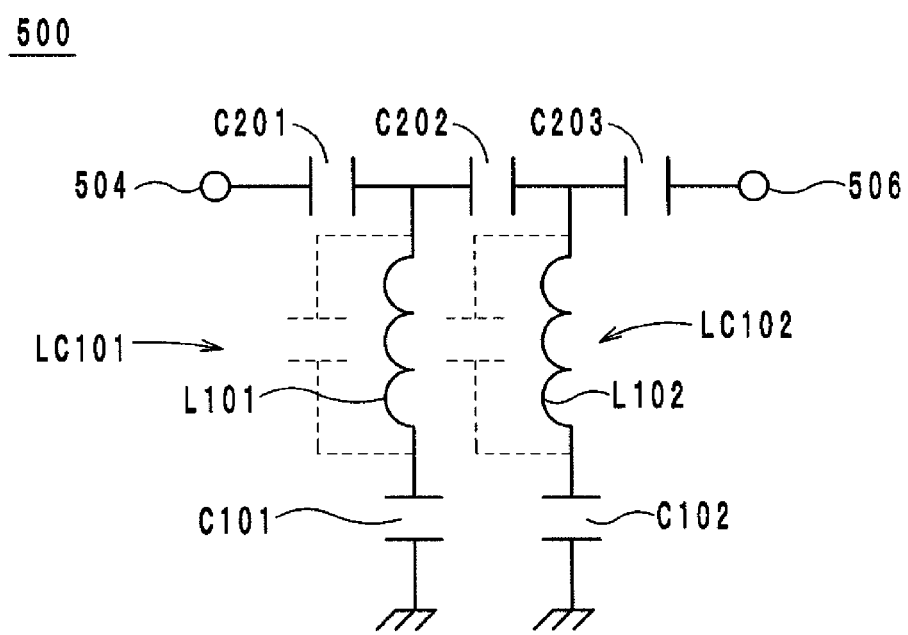
FIG. 8 is an equivalent circuit diagram of a high pass filter described in Japanese Unexamined Patent Application Publication No. 2008-167157.
Figure 9:
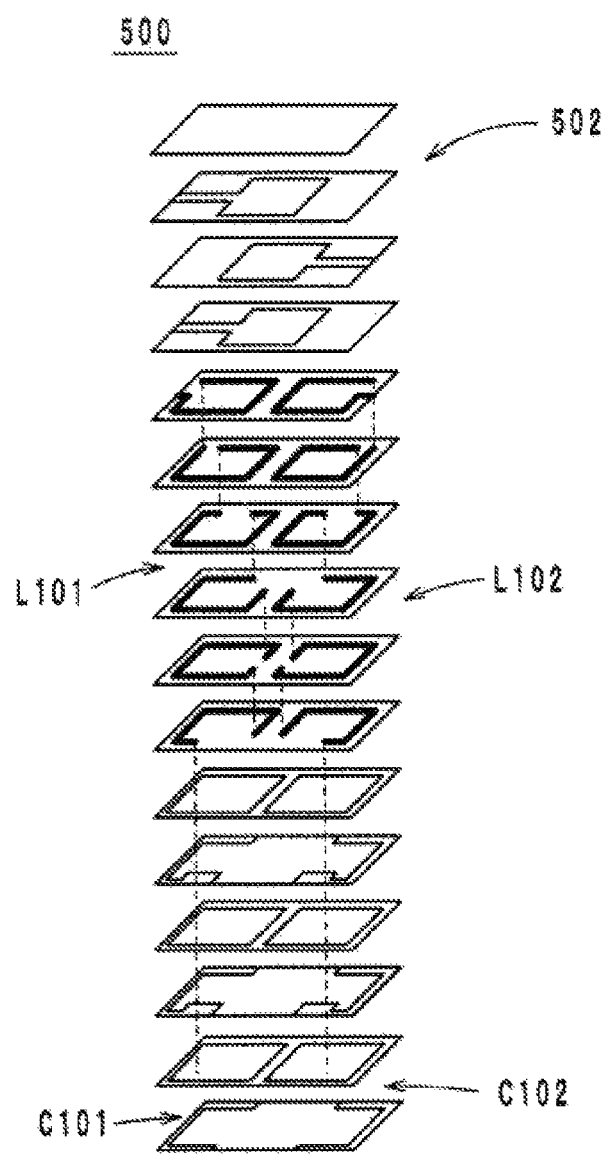
FIG. 9 is an exploded perspective view of the high pass filter shown in FIG. 8.

A configuration of the high pass filter 10c according to a third modification of a preferred embodiment of the present invention is described below with reference to the drawings. FIG. 7 is an exploded perspective view of the high pass filter 10c according to the third modification. The equivalent circuit diagram and the external perspective view of the high pass filter 10c are the same as or similar to those of the high pass filter 10 shown in FIGS. 1 and 2, descriptions of which are referred to where appropriate.

The high pass filter 10c of the third modification differs from the high pass filter 10b described above in the position of the capacitor conductor layer 34. The structure of the high pass filter 10c is described below, with an emphasis on this difference.

The capacitor conductor layer 34 is linearly or substantially linearly disposed on the upper surface of the insulator layer 16m. The capacitor conductor layer 34 is thus closer to the capacitor conductor layers 30 and 32 than to the inductor conductor layers 18f and 20f. Specifically, the capacitor conductor layer 34 has a linear or substantially linear shape that extends toward the front, and then turns to extend toward the right. The rear end of the capacitor conductor layer 34 is electrically connected to the via-hole conductor v4. The capacitor conductor layer 34 faces the capacitor conductor layer 32, with the insulator layer 16m interposed therebetween. The capacitor C11 is thus located between the capacitor conductor layer 34 and the capacitor conductor layer 32. The via-hole conductor v4 is included in the inductor L1, and the capacitor conductor layer 32 is included in the capacitor C5. The capacitor C11 is thus located between the inductor L1 (i.e., LC series resonator LC1) and the capacitor C5 (i.e., LC series resonator LC2). Except for the capacitor conductor layer 34, the configuration of the high pass filter 10c is similar to that of the high pass filter 10b and thus will not be described here.

With the high pass filter 10c of the third modification, as with the high pass filter 10b described above, approximately two attenuation poles that appear in the bandpass characteristic are able to be brought close to each other. Also similar to the high pass filter 10b, the high pass filter 10c is able to achieve a smaller size. Also as in the high pass filter 10b, the inductors L1 and L2 in of the high pass filter 10c have a large inductance value, because they are in the shape of or substantially in the shape of a three-dimensional helix.

Similar to the high pass filter 10 described above, in the high pass filter 10c of the third modification, which includes the capacitor conductor layer 34, a decrease in the quality factor of the inductors L1 and L2 is able to be significantly reduced or prevented.

Other Preferred Embodiments

High pass filters according to preferred embodiments of the present invention are not limited to the high pass filters 10, 10a, 10b, and 10c, and are able to be modified within the scope of the present invention.

Components, elements, and features of the high pass filters 10, 10a, 10b, and 10c may be combined with one another, for example.

In the high pass filter 10a, for example, the capacitor conductor layer 34 may face the inductor conductor layers 18a to 18e and 20a to 20e, instead of the inductor conductor layers 18f and 20f.

One or more LC series resonators may be added to any of the high pass filters 10, 10a, 10b, and 10c, for example. One or more capacitors may be added to the signal path SL, for example.

In the high pass filters 10, 10a, 10b, and 10c, circuit components, for example, an inductor and a capacitor, may be added between the LC series resonators LC1 and LC2 and the signal path SL.

In the high pass filters 10, 10a, 10b, and 10c, circuit components, for example, an inductor and a capacitor, may be added between the LC series resonators LC1 and LC2 and the outer electrodes 14c and 14d.

In the high pass filters 10b and 10c, for example, the capacitor conductor layer 34 may be electrically connected to the via-hole conductor v14, and may face the inductor conductor layer 18a or the capacitor conductor layer 30, with at least one insulator layer interposed therebetween.

Preferably, for example, only at least one of the inductor conductor layers 18a to 18f is provided. Similarly, only at least one of the inductor conductor layers 20a to 20f is preferably provided, for example.

The high pass filters 10, 10a, 10b, and 10c may include only one of the outer electrodes 14c and 14d, for example.

As described above, preferred embodiments of the present invention are applicable to high pass filters, and are particularly advantageous in that approximately two attenuation poles that appear in the bandpass characteristic are able to be brought close to each other without changing or destroying the symmetry of inductor electrodes and without increasing the device size.

While preferred embodiments of the present invention have been described above, it is to be understood that variations and modifications will be apparent to those skilled in the art without departing from the scope and spirit of the present invention. The scope of the invention, therefore, is to be determined solely by the following claims.

What is claimed is:

1. A high pass filter comprising:
a first input and output terminal;
a second input and output terminal;
at least one ground terminal;
a signal path disposed between the first input and output terminal and the second input and output terminal;
a first LC series resonator including a first inductor, a first capacitor, a first end electrically connected to the signal path, and a second end electrically connected to the at least one ground terminal, the first inductor, and the first capacitor;
a second LC series resonator including a second inductor, a second capacitor, a third end electrically connected to the signal path, and a fourth end electrically connected to the at least one ground terminal, the second inductor, and the second capacitor;
a third capacitor; and
a multilayer body including a stack of a plurality of insulator layers in a stacking direction; wherein
one electrode of the third capacitor is connected between the first capacitor and the first inductor, and another electrode of the third capacitor is connected between the second capacitor and the second inductor;
the first LC series resonator includes at least one first conductor layer disposed on a corresponding one of the plurality of insulator layers;
the second LC series resonator includes at least one second conductor layer disposed on a corresponding one of the plurality of insulator layers;
the third capacitor includes a first capacitor conductor layer facing at least one of the at least one first conductor layer and the at least one second conductor layer, with a corresponding at least one of the plurality of insulator layers interposed therebetween;
the at least one first conductor layer includes at least one first inductor conductor layer wound in a predetermined direction when viewed in the stacking direction and a second capacitor conductor layer; and
the at least one second conductor layer includes at least one second inductor conductor layer wound in a direction opposite to the predetermined direction when viewed in the stacking direction and a third capacitor conductor layer.

2. The high pass filter according to claim 1, wherein a capacitor conductor layer of the first LC series resonator at least partially overlaps with a capacitor conductor layer of the first capacitor when viewed from above.

3. The high pass filter according to claim 2, wherein the capacitor conductor layer of the first LC series resonator and the capacitor conductor layer of the first capacitor have a same or similar shape when viewed from above.

4. The high pass filter according to claim 1, wherein the first capacitor conductor layer faces the second capacitor conductor layer and the third capacitor conductor layer with a corresponding at least one of the plurality of insulator layers interposed therebetween, and is disposed closer to the second capacitor conductor layer and the third capacitor conductor layer than to the at least one first inductor conductor layer and the at least one second inductor conductor layer.

5. The high pass filter according to claim 1, wherein the first capacitor conductor layer faces the at least one first inductor conductor layer and the at least one second inductor conductor layer with a corresponding at least one of the plurality of insulator layers interposed therebetween, and is disposed closer to the at least one first inductor conductor layer and the at least one second inductor conductor layer than to the second capacitor conductor layer and the third capacitor conductor layer.

6. The high pass filter according to claim 1, wherein
the first inductor includes a first via-hole conductor passing through corresponding ones of the plurality of insulator layers in the stacking direction and electrically connecting the at least one first inductor conductor layer to the second capacitor conductor layer; and
the first capacitor conductor layer is electrically connected to the first via-hole conductor, faces the third capacitor conductor layer with a corresponding at least one of the plurality of insulator layers interposed therebetween, and is disposed closer to the third capacitor conductor layer than to the at least one second inductor conductor layer.

7. The high pass filter according to claim 1, wherein
the first inductor includes a first via-hole conductor passing through corresponding ones of the plurality of insulator layers in the stacking direction and electrically connecting the at least one first inductor conductor layer to the second capacitor conductor layer; and
the first capacitor conductor layer is electrically connected to the first via-hole conductor, faces the at least one second inductor conductor layer with a corresponding at least one of the plurality of the insulator layers interposed therebetween, and is disposed closer to the at least one second inductor conductor layer than to the third capacitor conductor layer.

8. The high pass filter according to claim 1, wherein
the plurality of first inductor conductor layers are electrically connected with at least one via-hole conductor such that the first inductor is provided with a helical or substantially helical shape extending in the stacking direction while being wound in the predetermined direction when viewed in the stacking direction; and
the plurality of second inductor conductor layers are electrically connected with at least one via-hole conductor such that the second inductor is provided with a helical or substantially helical shape extending in the stacking direction while being wound in a direction opposite the predetermined direction when viewed in the stacking direction.

9. The high pass filter according to claim 8, wherein
the at least one ground terminal includes a bottom portion on a surface located on one side of the multilayer body in the stacking direction; and
an end of the first inductor on the other side of the multilayer body in the stacking direction and an end of the second inductor on the other side of the multilayer body in the stacking direction are electrically connected by the bottom portion.

10. The high pass filter according to claim 9, wherein the second capacitor and the third capacitor are located closer to the other side of the multilayer body in the stacking direction than the first inductor and the second inductor.

11. The high pass filter according to claim 1, wherein the first capacitor is located below the first inductor in the stacking direction.

12. The high pass filter according to claim 1, wherein the first input and output terminal includes a top portion located at a left rear corner portion of a top surface of the multilayer body, a bottom portion located at a left rear corner portion of a bottom surface of the multilayer body, and a side portion located on a rear surface of the multilayer body.

13. The high pass filter according to claim 1, wherein the second input and output terminal includes a top portion located at a right rear corner portion of a top surface of the multilayer body, a bottom portion located at a right rear corner portion of a bottom surface of the multilayer body, and a side portion located on a rear surface of the multilayer body.

14. The high pass filter according to claim 1, wherein the at least one ground terminal includes a top portion located at a left front corner portion of a top surface of the multilayer body, a bottom portion located at a left front corner portion of a bottom surface of the multilayer body, and a side portion located on a front surface of the multilayer body.

15. The high pass filter according to claim 1, wherein the at least one ground terminal includes a top portion located at a right front corner portion of a top surface of the multilayer body, a bottom portion located at a right front corner portion of a bottom surface of the multilayer body, and a side portion located on a front surface of the multilayer body.

16. The high pass filter according to claim 1, wherein the first input and output terminal, the second input and output terminal, and the at least one ground terminal are formed by applying Ni plating, Sn plating, or Au plating onto a base electrode that includes Ag or Cu.

17. The high pass filter according to claim 1, wherein at least one of the first inductor and the second inductor is formed in a spiral shape.

* * * * *